United States Patent
Bruneau et al.

(10) Patent No.: US 11,600,739 B2
(45) Date of Patent: Mar. 7, 2023

(54) APPARATUS AND METHOD FOR PATTERNED PROCESSING

(71) Applicants: TOTAL SA, Courbevoie (FR); ECOLE POLYTECHNIQUE, Palaiseau (FR); CENTRE NATIONAL DE LA RECHERCHE SCIENTIFIQUE, Paris (FR)

(72) Inventors: Bastien Bruneau, Paris (FR); Erik Johnson, Paris (FR); Pavel Bulkin, Villebon sur Yvette (FR); Nada Habka, Bourg la Reine (FR); Gilles Poulain, Palaiseau (FR); Nacib Benmammar, Romainville (FR)

(73) Assignees: TOTAL SA, Courbevoie (FR); ECOLE POLYTECHNIQUE, Palaiseau (FR); CENTRE NATIONAL DE LA RECHERCHE SCIENTIFIQUE, Paris (FR)

( * ) Notice: Subject to any disclaimer, the term of this patent is extended or adjusted under 35 U.S.C. 154(b) by 599 days.

(21) Appl. No.: 16/614,959

(22) PCT Filed: May 18, 2018

(86) PCT No.: PCT/EP2018/063126
§ 371 (c)(1),
(2) Date: Nov. 19, 2019

(87) PCT Pub. No.: WO2018/211081
PCT Pub. Date: Nov. 22, 2018

(65) Prior Publication Data
US 2020/0185564 A1    Jun. 11, 2020

(30) Foreign Application Priority Data
May 19, 2017 (EP) .................................. 17305586

(51) Int. Cl.
  *H01J 37/32* (2006.01)
  *H01L 31/18* (2006.01)
  *H01L 31/0224* (2006.01)

(52) U.S. Cl.
CPC ...... *H01L 31/1804* (2013.01); *H01J 37/3222* (2013.01); *H01J 37/32091* (2013.01);
(Continued)

(58) Field of Classification Search
CPC .............. H01L 43/12; H01L 21/31144; H01L 21/31155; H01L 21/0332; H01L 21/0337;
(Continued)

(56) References Cited

U.S. PATENT DOCUMENTS

| | | | | |
|---|---|---|---|---|
| 6,238,512 B1* | 5/2001 | Li | .................... | H01J 37/321 156/345.43 |
| 6,303,932 B1* | 10/2001 | Hamamura | ............. | H01J 37/28 250/397 |

(Continued)

FOREIGN PATENT DOCUMENTS

EP    3 136 419    3/2017

OTHER PUBLICATIONS

International Search Report, PCT/EP2018/063126, dated Jul. 17, 2018.
(Continued)

Primary Examiner — Haissa Philogene
(74) Attorney, Agent, or Firm — Nixon & Vanderhye (57) ABSTRACT

An apparatus for patterned processing includes a source of input gas, a source of energy suitable for generating a plasma from the input gas in a plasma region and a grounded sample holder configured for receiving a solid sample. The apparatus includes a mask arranged between the plasma region and the grounded sample holder, the mask having a first face oriented toward the plasma region and a second face ori-
(Continued)

ented toward a surface of the solid sample to be processed, the mask including a mask opening extending from the first face to the second face, and an electrical power supply adapted for applying a direct-current bias voltage to the mask, and the mask opening being dimensioned and shaped so as to generate spatially selective patterned processing on the surface of the solid sample.

19 Claims, 2 Drawing Sheets

(52) U.S. Cl.
CPC ............ *H01J 37/32568* (2013.01); *H01J 37/32715* (2013.01); *H01L 31/022458* (2013.01)

(58) Field of Classification Search
CPC ........... H01L 21/76826; H01L 31/1804; H01L 31/022458; H01L 21/266; H01J 37/32146; H01J 37/32357; H01J 37/32422; H01J 37/3244; H01J 2237/3343; H01J 37/32091; H01J 37/3222; H01J 37/32568; H01J 37/32715; H01J 37/32366; H01J 37/32623; C23C 14/3485; C23C 14/3435; C23C 14/3442; C23C 14/345; C23C 16/042
See application file for complete search history.

(56) References Cited

U.S. PATENT DOCUMENTS

| | | | | |
|---|---|---|---|---|
| 6,335,534 | B1* | 1/2002 | Suguro | H01J 37/3171 250/424 |
| 8,852,962 | B2* | 10/2014 | Verhaverbeke | H01L 21/67161 438/738 |
| 2006/0042752 | A1* | 3/2006 | Rueger | H01L 21/02274 156/345.1 |
| 2012/0248328 | A1 | 10/2012 | Reneau et al. | |
| 2012/0289039 | A1* | 11/2012 | Kajiwara | H01L 27/11519 438/588 |
| 2013/0045570 | A1* | 2/2013 | Schuegraf | H01L 21/561 257/E21.599 |
| 2013/0287964 | A1 | 10/2013 | Radovanov et al. | |
| 2014/0051232 | A1* | 2/2014 | Burghout | H01L 21/78 438/460 |
| 2014/0360429 | A1* | 12/2014 | Chaudhary | H01J 37/32568 118/723 I |
| 2015/0325410 | A1 | 11/2015 | Godet et al. | |

OTHER PUBLICATIONS

Written Opinion, PCT/EP2018/063126, dated Jul. 17, 2018.
R.M. Swanson, "Point-Contact Solar Cells: Modeling and Experiment," Solar Cells, 117 (1986), 85-118.

* cited by examiner

APPARATUS AND METHOD FOR PATTERNED PROCESSING

TECHNICAL FIELD OF THE INVENTION

The invention relates to an apparatus and method for patterned processing.

More precisely, the invention relates to a system and a method for patterning a solid sample surface with millimetric or sub-millimetric spatial resolution.

In particular, the invention relates to an apparatus and a method for forming patterned thin film by plasma deposition or, respectively, patterned openings by plasma etching, at a moderate cost compared to conventional masking, photolithography or laser processing steps.

The invention also relates to the manufacturing of any solar cell architecture where a patterning step is required. The invention can be used for high efficiency solar cells at reduced manufacturing costs. In particular, the invention applies to the manufacture of interdigitated back contact (IBC) solar cells.

BACKGROUND INFORMATION AND PRIOR ART

Numerous documents describe apparatus and methods for the manufacture of devices incorporating patterned thin film such as solar cell devices.

The steps of thin film deposition and/or etching can be realized by different techniques and in particular by plasma enhanced chemical vapour deposition (PECVD) in general at low temperature (less than 300° C.).

In microelectronics, the patterning step is generally based on photolithography to generate patterned thin films with sub-micrometric spatial resolution and with very high aspect ratios (up to about 1/100). However, photolithography requires additional materials for depositing and removing a photoresist masking layer, processing steps and expensive tools, such as a stepper, and thus induces large manufacturing costs. Much lower resolution techniques may be used, but these techniques also involve multiple masking and etching steps. For example, patent document US 2015/0325410 A1 describes an etching apparatus comprising a plasma chamber, a substrate holder and an extraction plate with an aperture through which an ion beam is directed toward the substrate holder.

Grounded masks placed in contact with the surface of the substrate have been used to obtain patterned deposition in a single step. However, the obtained patterned feature accuracy is directly linked to the mask thinness and therefore inversely to the mask mechanical stability. Additionally, any spacing between the grounded mask and the surface leads to feature spreading of the patterned deposition. Moreover, contact between a mask and a surface produces contamination and/or damage to the surface.

Laser ablation can also be used for forming holes in a thin film stack without involving masking. However, laser processing is also expensive.

High efficiency industrial crystalline silicon (c-Si) solar cells use localized contacts to reduce the surface area in contact with metal or to gain a geometrical advantage by reducing shading due to metallic gridlines.

High efficiency (>20%) solar cells use point contacts. The highest efficiency industrial c-Si cells use an interdigitated back contact (IBC) configuration. However, such designs are expensive to implement, involving numerous process steps such as laser ablation for forming dielectric openings for point contacts or lithography for forming the IBC contacts. Nevertheless, IBC designs and point contacts are currently used in industry, as described by R. Swanson et al. (Proceeding of the 33rd IEEE PVSC, San Diego, Calif., USA, 2008).

Another industrial high-efficiency design (HIT technology) uses a thin intrinsic amorphous hydrogenated silicon (a-Si:H) layer, deposited by PECVD, as the passivating layer. HIT passivation is advantageously realized at low temperature (less than about 250° C.) thus reducing the thermal budget of the process, and resulting in very good passivation properties for the wafer surface.

Panasonic (Masuko et al., IEEE Journal of Photovoltaics 4 (2014) 1433-1435) has recently demonstrated an IBC solar cell design using large area HIT passivation. However, using a thin intrinsic a-Si:H passivation layer in an IBC configuration involves a subsequent patterning step for the doped layers, using photolithography, thus reducing the cost effectiveness of the low temperature HIT passivation.

One of the challenges in implementing a masking operation on the pristine surface of a silicon wafer, in particular after removal of the native oxide, is the high sensitivity of this surface to damage and contamination.

SUMMARY OF THE INVENTION

Therefore, one object of the invention is to provide an apparatus and a method for forming patterned devices with applications to any type of solar cells or semiconducting devices or optoelectronic devices, at a reduced manufacturing cost and preferably at low temperature.

A further object of the invention is to provide an alternative apparatus and method for forming interdigitated contacts in IBC solar cells and/or for forming dielectric openings for point contacts in solar cells.

A further object of the invention is to provide a system and a method for patterning electronic or optoelectronic devices, for example for forming patterned layers or a patterned surface, without applying a mask directly on the surface or in contact with the surface of the device.

A further object of the invention is to provide a fully integrated method and apparatus enabling different deposition and/or etching steps, for forming various patterned and un-patterned features on a same substrate and in a same process flow and/or in a same processing tool chamber, so as to prevent surface damage, contamination, and to avoid additional tool-related capital cost.

The above objects are achieved according to the invention by providing an apparatus for patterned processing comprising a source of input gas, a source of energy suitable for exciting the input gas and for generating a plasma in a plasma region and a grounded sample holder configured for receiving a solid sample.

According to the invention, the apparatus comprises a mask arranged between the plasma region and the grounded sample holder, the mask having a first face oriented toward the plasma region and a second face oriented toward a surface of the solid sample to be processed, the mask comprising at least one mask opening extending through the mask from the first face to the second face, and an electrical power supply adapted for applying a direct-current non-null bias voltage to the mask, the mask being placed at a distance less than a threshold distance from the surface of the solid sample so as to prevent plasma generation between the mask and the solid sample, and said mask opening being dimensioned and shaped so as to generate spatially selective patterned processing by selecting and focusing ions from the plasma on the surface of the solid sample.

The advantage of using a DC biased mask is that patterned features spreading can be limited and even adjusted using the DC bias voltage applied to the mask. As a result, the patterned features have smaller spatial dimensions than the corresponding mask openings.

According to a particular aspect of the invention, the mask opening has an opening width ranging in the sub-millimeter to millimeter range taken along a first direction parallel to the second face of the mask, the mask opening having an opening height in another direction taken transversely to the second face of the mask, defining an aspect ratio of the opening height over the opening width, and the aspect ratio is larger than 1.

According to a particular and advantageous embodiment, the mask opening has a conical or cylindrical shape or a shape chosen to generate a pattern with determined spatial profile on the surface of the substrate.

According to another particular aspect, the mask comprises a plurality of mask openings arranged in a one-dimension or two-dimension periodic array.

According to an embodiment, the mask is made of an electrically conductive material and the mask is placed at a non-null distance from the surface of the solid sample.

According to another embodiment, the mask comprises an electrically conductive part on the first face, an electrically conductive part partially or fully covering the side walls of the mask opening, and the second face of the mask comprises an electrically insulating part, the electrically insulating part of the second face of the mask being in contact with the surface of the solid sample to be processed.

According to another particular and advantageous embodiment, the mask comprises a first conductive part a second conductive part electrically isolated from the first conductive part, the first conductive part comprising a first-type mask opening, and the second conductive part comprising a second-type mask opening, the electrical power supply is adapted for applying a first direct-current bias voltage to the first conductive part and the electrical power supply is adapted for applying a second direct-current bias voltage to the second conductive part.

Preferably, in this last embodiment, the first direct-current bias voltage and the second direct-current bias voltage have opposite polarities at a same instant.

In a particular embodiment, the mask further comprises an electrically insulating part mechanically connecting the first conductive part to the second conductive part.

According to a particular embodiment, the mask is mounted on a translation or rotating stage.

According to different embodiments, the source of energy comprises another electric power supply connected to a planar electrode arranged parallel to the sample holder and configured to generate a capacitively coupled plasma, or another electric power supply connected to a coil electrode arranged to generate an inductively coupled plasma or a microwave antenna coupled to the plasma generation chamber via waveguides and arranged to generate a microwave plasma and/or a magnetic field generation system for generating a magnetic field in the plasma region.

In some applications, a positive DC bias voltage is applied to the mask with respect to the grounded sample holder supporting the sample to be processed. In addition, the DC bias voltage applied to the mask can also be used to enhance cleaning of the mask after patterned processing obtained by plasma, for example using a negative DC bias voltage with respect to the grounded electrode after using a positive DC bias voltage for patterned processing obtained by plasma.

In other applications, a negative DC bias voltage is applied to the mask for patterned processing obtained by plasma. In this case, a positive DC bias voltage can be used to clean the mask after patterned processing obtained by plasma.

The invention also concerns a method for patterning a solid sample comprising the following steps:
- placing a solid sample on a grounded sample holder of an apparatus for plasma processing,
- placing a mask between the grounded sample holder and a plasma region of the apparatus for plasma processing, the mask having a first face, a second face and at least one mask opening extending through the mask from the first face to the second face, the first face being oriented toward the plasma region and the second face being oriented toward a surface of the solid sample to be processed;
- injecting an input gas in the plasma region of the apparatus for plasma processing;
- applying an energy suitable for exciting the input gas and for generating a plasma in the plasma region; and
- applying a non-null direct-current bias voltage to the mask, the mask being placed at a distance less than a threshold distance from the solid sample so as to prevent plasma generation between the mask and the solid sample, and said mask opening being dimensioned and shaped so as to generate spatially selective patterned processing by selecting and focusing ions from the plasma on the surface of the solid sample.

According to various aspects of the method, the input gas and direct-current bias voltage are selected so as to generate on the surface of the solid sample, respectively, patterned layer deposition, patterned etching, patterned ion bombardment, patterned doping, patterned cleaning, patterned densification and/or patterned surface functionalization.

In a particular embodiment, the direct-current bias voltage is positive during one processing step and, respectively, negative during another processing step.

Preferably, the direct-current bias voltage is adjusted in amplitude so as to generate spatially selective patterned features having determined size and/or profile.

Preferably also, the distance between the mask and the surface of the solid sample is adjusted so as to generate patterned features having determined size and/or profile.

According to a particular embodiment, the mask comprises a first conductive part, a second conductive part electrically isolated from the first conductive part, the first conductive part comprising a first-type mask opening, and the second conductive part comprising a second-type mask opening, and the method comprises the following steps
- injecting a first input gas into the plasma region, applying a first direct-current bias voltage to the first conductive part and applying a second direct-current bias voltage to the second conductive part, so as to generate a first-type patterned processing on the surface of the solid sample by selecting and focusing a first type of ions from the plasma through the first-type mask opening;
- injecting another input gas into the plasma region, applying a third direct-current bias voltage to the first conductive part and applying a fourth direct-current bias voltage to the second conductive part so as to generate a second-type patterned processing on the surface of the solid sample by selecting and focusing another type of ions from the plasma through the second-type mask opening.

The apparatus and method thus enable to perform patterned processing obtained by plasma on the surface of the substrate on areas defining a pattern which is delimited by the mask opening(s) and preferably with a smaller spatial extension than the mask opening(s), so as to form a pattern on the surface of the substrate.

In a particular application, the present disclosure enables spatially selective deposition of patterned layer(s) using plasma enhanced chemical vapour deposition. Preferably, this is achieved without contact between the DC biased mask and the processed surface. Depending on the plasma conditions, and in particular on the chemical composition of the input gas, the present disclosure also enables spatially selective etching of the surface of the substrate, thus forming a patterned surface with openings, using plasma enhanced chemical vapour etching, preferably without touching the substrate surface. In other conditions of combined DC bias voltage and adapted chemistry, the present disclosure enables spatially selective surface modification obtained by plasma, such as patterned surface texturing, surface cleaning and/or surface functionalization. The present disclosure also enables spatially selective doping by ion bombardment. In other words the invention achieves a masking operation with millimeter or sub-millimeter spatial resolution without applying a photoresist masking layer on the surface of the substrate.

Furthermore, multiple patterns can be implemented by changing the mask configuration and/or the DC bias voltage in real time between different processing steps. In that way, a uniform, maskless deposition, etching or cleaning process can be done in the same plasma reactor chamber by removing the mask from the region between the plasma area and the sample surface, so that plasma processing is not limited by the mask but extends uniformly across the surface of the solid sample.

The invention also relates to the use of the apparatus for patterned processing according to any embodiment disclosed herein and/or the method according to any embodiment disclosed herein for the manufacture of a solar cell, a semiconducting device or an optoelectronic device.

The invention applies in particular to the manufacture of photovoltaic solar cell devices using a plasma generating system and/or using a method of manufacturing patterned devices as disclosed herein.

BRIEF DESCRIPTION OF THE DRAWINGS

This description is given for non limiting illustrative purposes only and will be better understood when referring to the annexed drawings wherein.

DETAILED DESCRIPTION OF EXAMPLE(S)

The present disclosure concerns a technique for patterned processing obtained by plasma, in particular to deposit and/or etch patterned features on a surface of a substrate, thin film or stack of thin films at a reduced manufacturing cost, and preferably without touching said surface.

Device and Process

General Plasma Processing Apparatus

Figure 1:
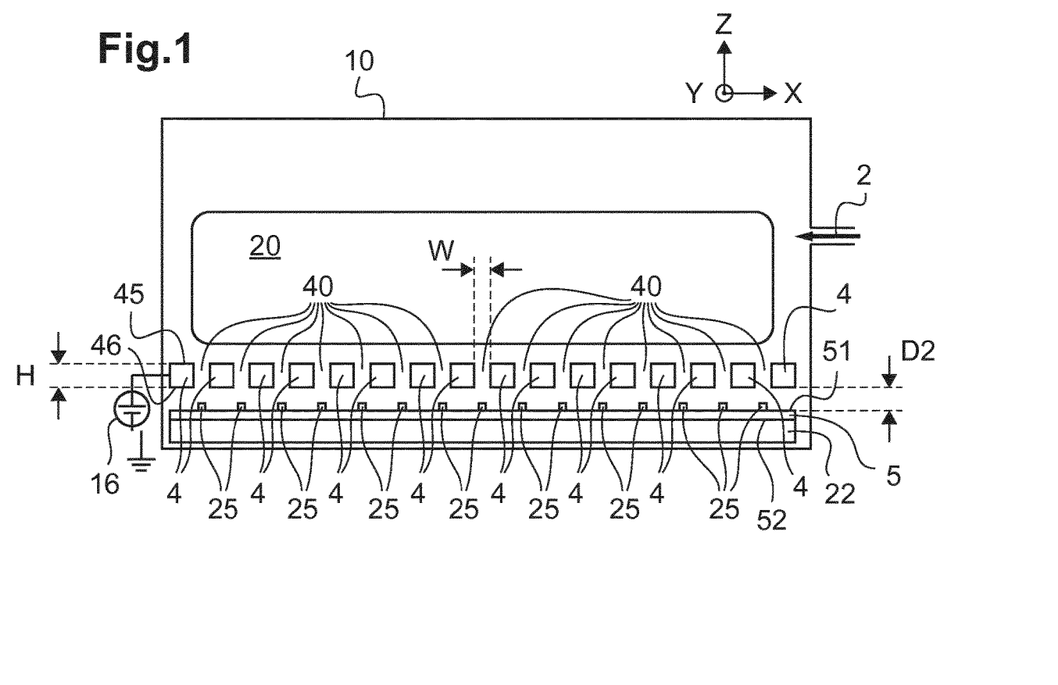
FIG. 1 represents schematically a cross-section of an apparatus for patterned processing according an embodiment of the invention.

FIG. 1 schematically represents an apparatus for patterned processing according to the invention.

The apparatus comprises a gas feed assembly (not represented) for injecting an input gas 2 and a source of energy (not represented) adapted for generating a plasma 20 by exciting the input gas 2 in a plasma region.

The gas feed assembly comprises for example a gas injection line connected to one or several gas sources for injecting the input gas or gas mixture in the plasma region.

The plasma region is preferably located in a processing chamber. The processing chamber may operate under low pressure, or, in other words, at a pressure lower than the atmospheric pressure. Alternatively, the processing chamber may operate at high pressure, or, in other words, at a pressure higher than or equal to the atmospheric pressure.

Within the present disclosure, the source of energy may be selected among a source of electric energy and/or a source of magnetic energy. The source of electric energy may be of radio-frequency or microwave type. Whatever the type of plasma generation means, we consider plasma 20 generated in a plasma region.

For example, the source of energy comprises an electric power supply connected between two plane and parallel electrodes and configured to generate a capacitively coupled plasma (or CCP) in a plasma region located between the electrodes. In an alternative embodiment, the source of energy comprises an electric power supply connected to a coil electrode arranged to generate an inductively coupled plasma (or ICP). The capacitively or inductively coupled plasma generation apparatus may further comprise a magnetic field generation system for generating an additional magnetic field in the plasma region.

In another alternative embodiment, the source of energy comprises a microwave antenna coupled to the plasma generation region via waveguides and adapted to generate microwave plasma.

The apparatus illustrated on FIG. 1 comprises a grounded sample holder 22. The sample holder 22 has for example a flat surface arranged to receive a sample 5. The sample holder 22 may form a grounded electrode of the plasma generating apparatus.

A solid sample 5 is placed on the grounded sample holder 22. The solid sample 5 has a first surface 51 and a second surface 52. More precisely, the second surface 52 of the solid sample 5 is in contact with grounded sample holder 22. The first surface 51 of the substrate 5 is oriented toward the plasma region. The solid sample 5 is for example a semiconductor such as monocrystalline or polycrystalline silicon or a glass substrate. For example, the solid sample 5 is a plane and parallel substrate, such as a silicon wafer. The surface 51 of the substrate 5 may be flat or may be a patterned surface. The solid sample 5 may include a thin film stack on the first surface 51 and/or on the second surface 52. The first surface 51 is herein the surface to be processed. The first surface 51 is preferably placed in an XY plane according to an orthonormal coordinate system (XYZ).

The apparatus illustrated on FIG. 1 further comprises a direct-current (DC) biased mask 4 placed between the plasma region and the sample holder 22. Preferably, the mask 4 has a generally plane geometry and is placed in an XY plane. More precisely, the mask 4 has a first face 45 oriented toward the plasma region and a second face 46 oriented toward the sample holder 22. The first face 45 and the second face 46 are preferably placed in XY planes. The mask 4 comprises at least one mask opening 40 extending from the first face 45 to the second face 46. In the example illustrated on FIG. 1, the mask 4 comprises a plurality of mask openings 40 or through holes. The mask 4 comprises plain parts in between the mask openings 40. In a variant, the mask 4 may comprise a single mask opening 40.

The mask opening 40 may have a cross-section profile along the X axis and extend along the Y axis with a similar profile, for generating one-dimensional patterns extending longitudinally on the surface of the sample along the Y-axis.

Alternatively, the mask opening may have a two-dimension cross-section profile along the X axis and Y axis. For example, the mask opening may have a similar profile as illustrated in FIG. 1 along the Y axis, for generating patterns limited in both the X and Y directions on the surface 51 of the solid sample 5.

For example, a mask opening 40 has a width W along axis X and a height H along axis Z. The height H of the mask opening is generally equal to the mask thickness. Generally, the width W along axis X is between 0.1 mm and 5 mm, and preferably between 0.5 mm and 2 mm. The mask opening has an aspect ratio (height over width, H/W). This aspect ratio is larger than one and preferably larger than 2. For example, the openings 40 have a rectangular shape, with a width W of 0.5 mm and a height H of 2 mm, and thus an aspect ratio of 4. The dimensions of the opening in the Y axis are greater than or equal to those in the X axis.

Preferably the mask is made of an electrically conductive material. A DC power supply 16 applies a DC bias voltage V[4] to the mask 4.

The source of energy and input gas are used to generate a plasma 20 in a plasma region located on the side of the first face 45 of the mask 4.

The mask 4 is placed at a distance D2 from the surface 15 of the sample 5 to be processed. The distance D2 is lower than a threshold distance so as to prevent plasma generation between the second face 46 of the mask 4 and the sample surface 51. For example, the distance D2 is set to between 0.1 mm and 2.0 mm and the DC bias voltage is less than 100 V or 200 V, so as to avoid plasma ignition between the mask 4 and the surface 51 of the sample 5 for a chosen pressure P of about 1 Torr, generally between 0.1 Torr and 10 Torr. Thus, a single plasma area 20 is generated on one side of the mask.

Using an appropriate DC bias voltage, the mask openings 40 allow for patterned processing on the first surface 51 of the solid sample 5.

More precisely, the mask 4 performs a selection operation on the excited or ionized species of the plasma, depending on the DC bias voltage and polarity. The plasma comprises radicals, positive ions and negative ions. A portion of the ions having the same polarity as the DC bias (positively charged ions for the case of a mask biased at a positive DC bias voltage) pass through the mask openings 40 and get focused by the DC bias on the surface 51 of the sample 5. Ions of the other polarity will be almost fully collected by the biased mask. In other words, the mask opening with a DC bias forms an electrostatic lens that selectively focuses ions of the same polarity as the DC bias voltage. In contrast, ions having the opposite polarity to the DC bias voltage are attracted by the mask and do not pass through the mask opening. Moreover, neutral radicals are lost to the walls of the mask openings. The rather high aspect ratio of the mask opening(s) is important to ensure that radicals are effectively scavenged by the walls of the mask due to their random motion and subsequent reaction with the sidewalls of the mask. Thus, the DC biased mask enables patterned processing of the sample surface using ions focused through the mask openings. As a result, the patterned features formed on the sample surface 51 have smaller width than the width W of the mask openings.

Advantageously, the DC bias voltage applied on the mask 4 is controlled and adjusted so as to influence the profile of the patterned processing on the solid sample 5. More precisely, the higher the DC bias voltage, the narrower the patterned processing. Therefore, if a larger voltage is applied from the beginning of the process, the width of the patterned features will be narrower than the width of the mask openings.

In a particular application, a deposition precursor gas is used to generate a deposition plasma in a plasma region and a positive DC bias voltage V[4] is applied to the mask to obtain a narrow deposition of patterned features 25 on the surface 51 of the sample. In an example, a plasma is used to obtain patterned deposition of amorphous silicon patterned features 25 on a substrate 5 consisting of a monocrystalline wafer.

Alternatively, a negative DC bias voltage is applied to the mask to select another type of ions.

In another application, another precursor gas is used for generating an etching plasma.

In yet another application, another precursor gas is used for generating ion bombardment through the DC biased mask.

Embodiment of a CCP Plasma Reactor

We will now describe in more detail a particular embodiment of a plasma processing apparatus based on a CCP-type plasma generation system.

Figure 2:
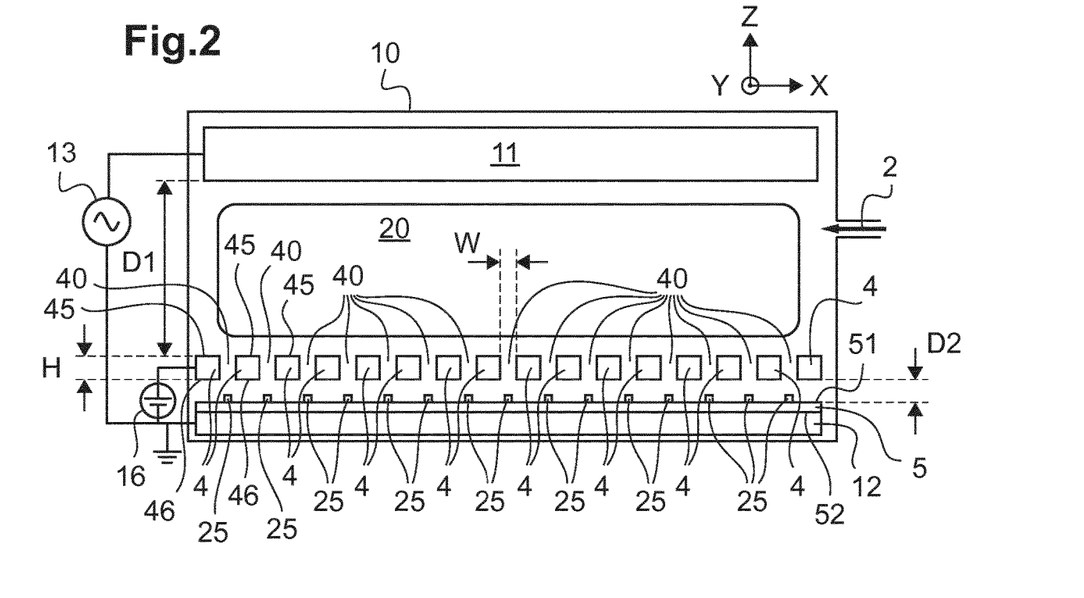
FIG. 2 represents schematically a cross-section of a capacitively coupled apparatus for patterned processing according to a particular embodiment.

FIG. 2 schematically represents an apparatus for patterned processing comprising a plasma reactor chamber or vacuum chamber 10.

More specifically, we consider the representative case of a radio-frequency (RF) capacitively coupled plasma reactor. The RF-CCP system comprises an electrode assembly consisting of a first electrode 11 and a second electrode 12 arranged in the vacuum chamber 10. The first electrode 11 and the second electrode 12 are flat and placed in parallel planes extending along X and Y directions according to an orthonormal coordinate system (XYZ). In this embodiment, the second electrode 12 forms a sample holder.

The vacuum chamber 10 is fluidically connected to a gas injection line, for injecting an input gas 2 or gas mixture into the vacuum chamber. A pumping system (not represented) is connected to the vacuum chamber for maintaining vacuum or a low pressure inside the vacuum chamber and for removing residual gas. Pressure sensor, flowmeters and control devices are generally provided on the gas injection line, in the vacuum chamber and/or on the pumping system so as to control pressure and flowrate inside the vacuum chamber during plasma processing. The gas injection system (not represented on FIG. 2) is configured so that the input gas fills the inter-electrode volume between the first electrode and the second electrode.

As an example of operating conditions, the input gas is a mixture of a deposition precursor gas (such as $SiH_4$) or an etching precursor gas (such as $SF_6$) and possibly a second buffer gas (such as $H_2$) at a pressure between 0.1 and 10 Torr. The temperature of the solid sample is less than 400° C., and preferably less 300° C.

In the example shown, the second electrode 12 is grounded. An alternative current (AC) power supply 13 applies an AC voltage V[1] to the first electrode 11 with respect to the grounded electrode 12. The applied AC voltage V[1] is preferably in the radio-frequency (RF) range (from 500 kHz to 100 MHz). According to an aspect of the present disclosure, the radio-frequency electric power supply is configured for generating a RF voltage applied to the first electrode 11, wherein the RF voltage is constant over time, or comprises a single base frequency in the range between 500 kHz and 100 MHz or comprises a plurality of harmonics of a base frequency in the range between 500 kHz and 100 MHz, wherein the respective amplitudes and phases of the plurality of harmonics are selected so as to generate voltage difference having waveform with an amplitude asymmetry (for example resembling a series of peaks or valleys) or with a slope asymmetry (for example resembling a sawtooth voltage waveform). For example, the amplitude of the RF voltage applied to the first electrode 11 is between 200V and 800V.

The second electrode 12 forms a grounded sample holder. A solid sample 5 is placed on the grounded second electrode 12. The solid sample 5 has a first surface 51 and a second surface 52. More precisely, the second surface 52 of the solid sample 5 is in contact with the grounded second electrode 12. The first surface 51 of the substrate 5 is oriented toward the first electrode 11. The solid sample 5 is for example a semiconductor such as monocrystalline or polycrystalline silicon wafer or a glass substrate. For example, the solid sample 5 is a plane and parallel substrate, such as a silicon wafer. The surface 51 of the substrate 5 may be flat or may be a patterned surface. The solid sample 5 may include a thin film stack on the first surface 51 and/or on the second surface 52. The first surface 51 is herein the surface to be processed.

The system and method of the present disclosure performs masking of a plasma processing, such as PECVD deposition and/or etching or another patterned surface modification. The masking is preferably contactless.

This is achieved by using a direct-current (DC) biased mask 4 placed in front of the first surface 51 whereon a patterned modification, such as patterned deposition, patterned etching or patterned surface modification is desired.

In the embodiment of FIG. 2, the mask 4 is arranged to be spatially separated from both the solid sample 5 and the first electrode 11. Preferably, the mask 4 has a generally plane geometry and is placed in an XY plane, parallel to the first electrode 11 and to the second electrode 12. More precisely, the mask 4 has a first face 45 oriented toward the plasma region and a second face 46 oriented toward the sample holder 22. The first face 45 of the mask 4 is placed at a first distance D1 from the first electrode 11, and, respectively, the second face 46 is placed at a second distance D2 from the second electrode 12. For example, D1 is comprised between 5 mm and 50 mm and D2 is comprised between 0.1 mm and 2 mm. The mask thickness ranges from 0.5 mm to about 10 mm.

In the example shown in cut-view on FIG. 2, the mask 4 comprises plain parts and a plurality of mask openings 40. In a variant, the mask 4 may comprise a single mask opening.

The mask opening 40 may have a cross-section profile along the X axis and extend along the Y axis with a similar profile, for generating one-dimensional patterns extending longitudinally on the surface of the sample along the Y-axis.

Alternatively, the mask opening may have a two-dimension cross-section profile along the X axis and Y axis. For example, the mask opening may have a similar profile as illustrated in FIG. 2 along the Y axis, for generating patterns limited in both the X and Y directions on the surface 51 of the solid sample 5.

Of course, more complex geometries of mask opening are also contemplated without departing from the frame of the present disclosure.

The mask opening may have 3D shape selected among a cylindrical shape, a conical shape, a partially spherical shape or a shape chosen to generate a pattern with determined spatial profile on the surface of the substrate. The mask opening may have 2D cross-section shape in an XY plane selected among a polygonal shape such as a square, rectangular, trapezoidal, circular or elliptic shape or a non-geometric shape, depending on the pattern to be formed on the first surface 51. The different mask openings 40 of a same mask 4 may have the same shape and size. As an alternative, the different mask openings 40 of a same mask 4 may vary in shape and/or dimensions. According to a particular and advantageous aspect, the mask 4 comprises a plurality of mask openings 40 arranged in a one-dimension or two-dimension periodic array.

As an example, the mask opening 40 has a cylindrical shape with a rectangular cross-section in an XY plane and an axis parallel to axis Z. The mask opening 40 has a width W along axis X and a height H along axis Z, determining an aspect ratio of height over width, or H/W, larger than one, and preferably larger than 2. Generally, the width W is between 0.1 mm and 5 mm, preferably between 0.5 mm and 2 mm, for instance a width W of 0.5 mm and a height H of 2 mm, defining an aspect ratio of 4.

The AC power supply 13 applies an AC voltage V[1] to the first electrode 11 with respect to the second grounded electrode 12, so as to generate a capacitively coupled plasma 20 in a plasma region between the first electrode 11 and the second electrode 12. A DC power supply 16 applies a DC bias voltage V[4] to the mask 4. The DC biased mask is arranged between the plasma 20 and the second electrode 12. The DC bias voltage is kept low enough, in the order of magnitude of less than 200 V or less than 100V, such that no plasma is generated between the mask 4 and the solid sample 5 due to a quenching effect. For example, the distance D2 is set between 0.1 and 2.0 mm and the DC bias voltage is between 10 V and 100V, so as to avoid plasma generation between the mask 4 and the surface 51 of the sample 5. The pressure P is generally selected between 0.1 Torr to 10 Torr, and preferably of about 1 Torr. Thus, a single plasma area is generated in the vacuum chamber 10, the plasma 20 extending between the first face 45 of the mask 4 and the first electrode 11.

Using an appropriate non-null DC bias voltage, the mask openings 40 allow for patterned processing on the first surface 51 of the solid sample 5. More precisely, mask openings 40 are dimensioned and set at a distance D2 from the first surface 51 of the solid sample so as to enable a more controlled and narrowed patterning of the plasma-processing on the first surface 51 as compared to that obtained with a shadow mask. The mask openings 40 and DC voltage applied to the mask determine the area(s) on the surface 51 of the sample whereon patterned processing occurs. On the contrary, the plain part of the mask prevents surface processing from occurring in areas laterally offset from a mask opening. It is outlined that the plasma 20 itself does not pass through the mask openings. Moreover, only some species of the plasma pass through the mask openings. More precisely, only some of the ions get through the mask and get focused by the DC bias when passing through the mask opening, while the radicals are lost to the walls of the mask. Indeed, ions of the opposite polarity as compared to the DC bias voltage, are attracted and screened by the mask. Only ions of the same polarity as the DC bias voltage pass through the mask opening and are focused due to an electrostatic lens effect. To obtain these combined effects, the aspect ratio of the mask opening is an important parameter to ensure that radicals are effectively "vacuum cleaned" by the walls of the mask opening. As a result, the apparatus enables processing of spatially selective patterned features 25 on the surface 51 of the solid sample 5. The surface 51 to be processed is preferably at a relatively small distance D2 from the mask opening to avoid spreading of the ions.

In an application example, the apparatus provides direct deposition of patterned features 25 on the surface 51 of the solid sample, without using a photoresist masking layer.

Advantageously, the DC bias voltage applied on the mask 4 is controlled and adjusted so as to influence the profile of the patterned deposition 25 on the solid sample 5. In particular, a positive DC bias voltage V[4] is applied to the mask to obtain a narrow deposition. As mentioned above, the higher the DC bias voltage, the narrower the deposition of patterned features 25. Therefore, if a larger voltage is applied from the beginning of the deposition, the width of the deposited line 25 will be narrower. For example, the DC bias voltage is set between 10 V and 100 V, and a pressure of 1 Torr is used to deposit amorphous silicon on a monocrystalline wafer.

Optionally, the input gas mixture comprises a deposition gas and a dopant gas, so as to deposit doped patterned features.

The system of FIG. 2 can be used for Plasma Enhanced Chemical Vapor Deposition (PECVD) over one or a plurality of patterned area(s) using an appropriate deposition precursor gas. In the example of FIG. 2, the relative proportion of patterned deposition features 25 versus non-deposited areas is adapted for an application to point contacts deposition. Patterned deposition is thus performed directly in a single step.

By changing the gas chemistry, the apparatus of FIG. 1 or 2 can also be used for plasma assisted etching of a patterned area on a surface or a thin film, using an appropriate input gas and an appropriate DC bias voltage applied to the mask. Thus, a patterned device may be obtained by applying spatially resolved plasma etching for forming openings in a dielectric layer on the surface 51 of the sample 5. This patterned structure may be realized in two steps: step 1—uniform deposition of a dielectric layer, and step 2—DC-biased mask etching to generate spatially resolved plasma etching. Optionally, these two steps are performed in a same process flow and/or in a single reactor chamber.

The patterned etching obtained by plasma can be used to clean the surface selectively on some areas prior to another deposition and/or etching step.

The DC biased mask allows one to deposit or etch thin-films in predetermined areas, thus achieving masking operation without using a photoresist masking layer. The critical dimensions and feature sizes of the patterned layers obtained by this technique are in the sub-millimeter range (from one to several hundreds of micrometers) and are consistent with those required for the fabrication of inter-digitated back contacts (IBC) solar cells or point contact openings for solar cells.

Using an appropriate input gas combined with an appropriate DC bias voltage applied to the mask, the apparatus can also be used for Physical Vapor Deposition (PVD) or for ion implantation. In these systems, a plasma is also used. For example, in PVD, a plasma is generated between a solid target and the grounded electrode forming the substrate holder. Similarly as disclosed above, a DC biased mask is inserted between the plasma region and the grounded electrode, so as to enable patterned processing with the same effects as disclosed for PECVD.

In another application, a plasma is generated from an input gas and a non-null DC bias voltage is applied to the mask so as to generate patterned ion bombardment of the surface 51 of the substrate. This particular process can be used for doping by ion implantation.

Preferably, the DC biased mask avoids touching the surface under patterned plasma processing. In an embodiment, the mask is made of an electrically conductive material and the distance D2 is non-null and lower than a determined threshold, so as to prevent plasma generation between the DC biased mask 4 and the grounded electrode 12. According to a variant of this embodiment, the distance D2 between the mask 4 and the solid sample 5 can be adjusted to gain further control over the profile of the patterned deposition on the solid sample. In this embodiment, the mask is for example made of stainless steel, or of aluminum or any other metal or metal alloy.

In an alternative embodiment, the mask 4 comprises an insulating coating on its second face 46 oriented toward the grounded electrode 12 and conducting parts on its first face 45 and/or on the side walls of the mask opening(s) 40. In this case, the insulating coating of the mask can be in contact with the first surface 51 of the solid sample 5 while the mask 4 is at non-null DC bias voltage relatively to the grounded electrode 12 and solid sample 5.

Figure 3:
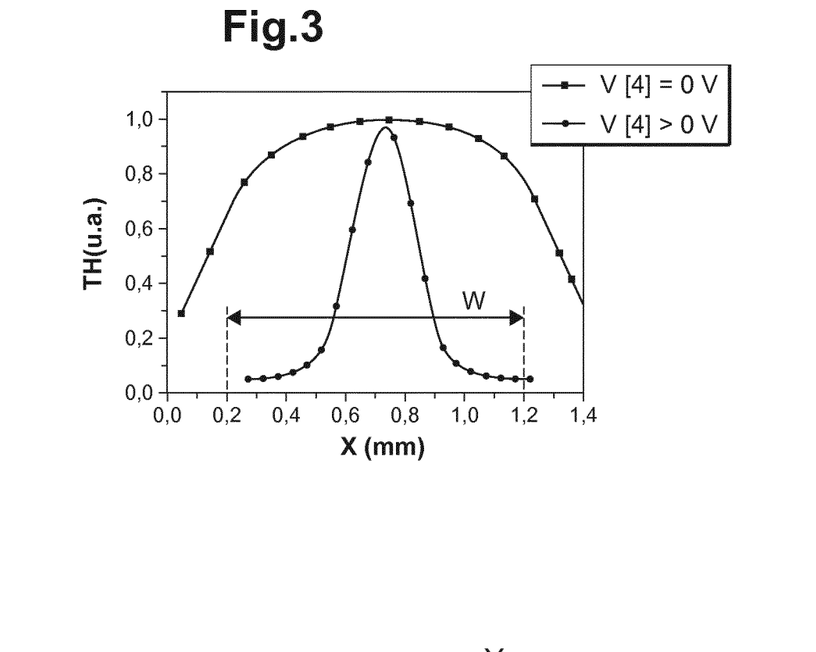
FIG. 3 shows experimental results of a patterned feature cross-section profile obtained using an apparatus for patterned processing with a mask as shown in FIG. 1 or 2, the mask being positively DC biased (curve linking circle points), and, respectively, the same mask being grounded (curve linking square points)

FIG. 3 shows experimental results obtained using a system as detailed in reference with FIG. 2 relatively to one mask opening 40. More precisely, FIG. 2 shows measurements of the normalized thickness TH of a deposited material along axis X, for a grounded mask, and respectively, for a positively DC biased mask. The deposited material can be amorphous silicon, alternatively it can be nanocrystalline silicon. The width W of the mask opening 40 is represented in dashed line. In the present example, the width W is about 1 mm. The aspect ratio H/W is 4. The curve linking square dots represents the thickness of deposited material, in the example amorphous silicon, when the mask is grounded (V[4]=0 volt). Respectively, the curve linking circle dots represents the thickness of deposited material using a positively DC biased mask (V[4] >0 volt) relatively to the grounded electrode 12. The full width at half maximum (FWHM) of the normalized thickness TH for the material deposited with a grounded mask is larger than the width W of the mask opening, due to spreading. On the contrary, the full width at half maximum (FWHM) of the normalized thickness TH for the material deposited with a positively DC biased mask is of about 400 micrometers, and thus much narrower than the width W of the mask opening. It is observed that the deposited material using the positively DC biased mask shows a narrower profile than the deposited material deposited using the grounded mask (V[4]=0 volt) and even narrower than the mask opening width W. Indeed, in the case of a positively DC biased mask, the mask opening 40 acts as an electrostatic lens which focuses the positive ions at the central part of the mask opening 40. As a result, the width of the patterned deposited layer 25 is narrower than the width W of the mask opening 40 when using the positively DC biased mask.

A positive DC bias may be used either for deposition or for etching. The gas chemistry determines the deposition or etching effect.

In another application, a negative DC bias voltage is applied to the mask which results in defocusing the positive ions leaving the mask opening(s). This may provide applications when a multiple step process is considered, and the width of the process area must be modified to be either less than or greater than the width of the opening 40.

This plasma generating apparatus configuration enables for example local deposition of a patterned layer 25. The lateral dimension of the patterned feature along the axis X is determined mainly by the combination of the width W of the mask opening 40, of the aspect ratio HW and of the DC bias voltage.

The shape and dimension of the mask opening 40 determines the shape and dimension of the patterned features along the other transverse direction Y. If the mask opening presents a symmetry of revolution along axis Z, then the mask openings acts as a spherical electrostatic lens, and generates a patterned feature having a symmetry of revolution. In contrast, if the mask opening has an elongated slit shape with a small width W of less than 1 mm along axis X and a length L of more than a few millimeters along axis Y, then the mask openings acts as a cylindrical electrostatic lens and generates a patterned feature having an elongated shape, which is smaller along the axis X than the width W of the mask opening 40.

Therefore, the use of a DC biased mask limits the need for machining narrow mask openings. Mask openings of millimeter of sub-millimeter dimensions are thus easier to machine than micrometric size mask openings. Moreover, the mask thickness is preferably higher than 1 millimeter, thus ensuring higher mechanical strength for the mask 4.

During deposition of a material on a surface 51 of a solid sample 5, the mask may get coated with the deposited material as well. As a result, the mask opening may become clogged. The processed sample being removed from the sample holder, a cleaning plasma chemistry, for example using $NF_3$ plasma, can be used to clean the mask. Advantageously, negative DC bias voltage can be applied to the mask to make the cleaning of the mask more efficient. Indeed, in this case, positive ions are attracted by the mask, therefore increasing the cleaning rate.

The present disclosure finds a most suitable application in the deposition of interdigitated contacts for interdigitated back contact (IBC) photovoltaic cells, and for dielectric opening in solar cells for point contacts.

As mentioned above, the mask 4 can be formed from a single electrically conductive part. For example, the mask openings 40 are machined as through holes or slits in a bulk metallic plate. Alternatively, the mask 4 comprises an assembly of parts attached to each other (see for example FIG. 4). In a variant alternative, the mask 4 comprises several parts, at least one of the parts being mobile relatively to the other(s).

Figure 4:
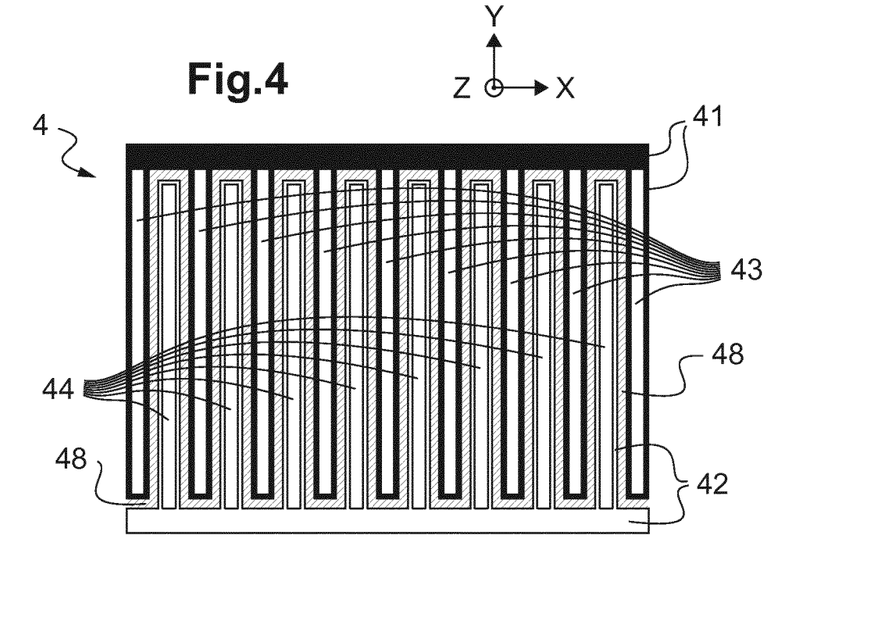
FIG. 4 represents schematically a top view of a mask comprising two metallic parts according to a particular embodiment.

FIG. 4 shows a top view of another example of mask. The mask 4 here comprises a first metallic part 41 and a second metallic part 42. The first metallic part 41 is electrically separated from the second metallic part 42, for example by an insulator 48. The first metallic part 41, the insulator 48 and the second metallic are attached to each other. In the example shown, the first metallic part 41 and second metallic part 42 have complementary shapes, such as two interdigitated combs. The first metallic part 41 surrounds a plurality of first mask openings 43. Similarly, the second metallic part 42 surrounds a plurality of second mask openings 44. A first DC bias voltage is applied to the first metallic part 41. A second DC bias voltage is applied to the second metallic part 42. Thus, the first metallic part 41 and second metallic part 42 can be put at different voltages. Preferably, a first non-null DC bias voltage and a second non-null DC bias voltage are applied one at a time. Advantageously, the sign of the first DC bias voltage is opposite to the sign of the second DC bias voltage. The respective signs of the first and second DC bias voltages may be reversed as a function of successive processing steps.

For instance, a first positive DC bias voltage (V[41] >0 volt) is applied to the first electrically conductive part 41, while a second negative DC bias voltage (V[42] <0 volt) is applied to the second electrically conductive part 42. In that way, narrow profiles of, respectively, the deposited material, the etched material, or the ion bombarded material, are formed in front of the first mask openings 43 whereas processing rate is decreased or even nullified in front of the second mask openings 44. For example, n-type doped semiconducting material is deposited through the first mask openings 43 using an appropriate input gas mixture, such as a mixture of dihydrogen ($H_2$), silane ($SiH_4$) and phosphine ($PH_3$) in the above DC bias voltage conditions.

Then, the polarity of the bias voltages is reversed, a negative DC bias voltage (V[41] <0 volt) is applied to the first electrically conductive part 41, while a positive DC bias voltage (V[42] >0 volt) is applied to the second electrically conductive part 42. The input gas is switched so as to deposit another patterned layer, ideally in this example a p-doped layer, from a gas mixture composed for example of dihydrogen ($H_2$), silane ($SiH_4$) and diborane ($B_2H_6$). In this way, by adapting jointly the DC bias voltage polarity and the plasma chemistry, p-type doped semiconducting material is deposited through the second mask openings 44 while nullifying the deposition rate in front of the first mask openings 43.

The mask in the example of FIG. 4 is adapted for an application of forming a n-type patterned layer corresponding to the first mask openings and, respectively, a p-type patterned layer corresponding to the second mask openings 44, for example, for generating interdigitated contacts in a single process flow and in the same plasma reactor.

Using the mask structure as shown on FIG. 4 and the above 2-steps process, the interdigitated n-type and p-type fingers of an IBC structure are deposited and self-aligned because of the design of the mask itself.

By removing the mask 4, it is also possible to generate uniform plasma processing, in between patterned processing steps and in the same processing chamber. Thus, the DC biased mask and processing conditions enable deposition of multiple patterned and/or non-patterned layers in sequential process steps.

In terms of performance, the use of a DC biased mask enables one to form patterns with sub-millimeter critical dimensions, down to about a hundred micrometers along an axis X and/or Y. Such critical dimensions are well-suited for current requirements in industrial solar cell manufacturing.

Therefore, the use of a DC biased mask as disclosed herein enables drastic reduction in processing costs for the manufacture of patterned layers or devices.

The biased mask process enables drastic step reduction, since it avoids multiple and expensive steps usually required for forming point contacts and/or IBC contacts. The biased mask and its operation may easily be implemented in currently available plasma chambers. The addition of a DC biased mask to a plasma reactor is expected to perturb the plasma in a very limited way. Therefore, the present disclosure may be used for any already optimized recipe with very small changes and does not require the development of new recipes.

The main application of the plasma generating apparatus and process disclosed herein is the formation of interdigitated back contacts or dielectric openings for the manufacture of high-efficiency crystalline silicon solar cells.

The present disclosure enables reducing drastically the manufacturing complexity of IBC cells by reducing the emitter formation steps by up to two, even reducing it to a single step. Furthermore, the IBC manufacturing steps are performed at low temperature, since plasma processing temperature is usually limited to less than 400° C. These advantages can drastically reduce the manufacturing costs of IBC cells.

Moreover, the present disclosure enables the use of both an IBC configuration and an HIT passivation step, without adding any additional process steps to the cell fabrication process flow.

Finally, surface damage and/or contamination are avoided, in particular when the mask 4 is distant from the patterned surface.

The present disclosure allows the implementation of high-performance elements, already used in industry, with a far simpler and cheaper process. No loss in performance should be expected using the DC-biased mask process and apparatus. The DC-biased mask can easily be implemented on existing tools only at the expense of inserting an additional mask between the electrodes of a plasma processing apparatus and connecting a DC bias power supply to the mask.

The present disclosure enables the formation of the IBC contacts in a single process step, at low temperature, and with the possibility to use a thin intrinsic a-Si:H passivation layer in the same plasma reaction chamber. The method and apparatus enable the use of both the IBC configuration combined with a HIT passivation step, without adding any additional processing step in the cell fabrication process flow. The method offers the advantage of being contactless which solves an important problem, as the surface of the clean wafer (with oxide removed) is very sensitive to damage and contamination.

Any plasma processing step that requires the activation or ionization of species by plasma can be utilized with this method. The DC biased masking technique, therefore, is equally useful for processes such as but not limited to deposition, etching, cleaning, densification and functionalization.

The DC biased masking technique as disclosed herein also applies to the manufacture of other photovoltaic devices, photodetectors and sensors.

The invention claimed is:

1. An apparatus for patterned processing comprising:
a source of input gas;
a source of energy configured to excite the input gas and to generate a plasma in a plasma region;
a grounded sample holder configured to receive a solid sample;
a mask disposed between the plasma region and the grounded sample holder, the mask having a first face oriented toward the plasma region and a second face oriented toward a surface of the solid sample to be processed, the second face comprising an electrically insulating part in contact with the surface of the solid sample to be processed, the mask comprising
at least one mask opening extending through the mask from the first face to the second face,
at least one electrically conductive part on the first face and partially or fully covering the side walls of the at least one mask opening; and
an electrical power supply configured to apply a direct-current non-null bias voltage to the mask, the mask being disposed in contact with the surface of the solid sample as to prevent plasma generation between the mask and the solid sample, said at least one mask opening being dimensioned and shaped to generate spatially selective patterned processing by selecting and focusing ions from the plasma on the surface of the solid sample.

2. The apparatus according to claim 1, wherein the at least one mask opening has an opening width ranging in the sub-millimeter to millimeter range taken along a first direction parallel to the second face of the mask, the at least one mask opening having an opening height in another direction taken transversely to the second face of the mask, defining an aspect ratio of the opening height over the opening width, the aspect ratio is being larger than 1.

3. The apparatus according to claim 1, wherein the at least one mask opening has a conical or cylindrical shape or a shape configured to generate a pattern with determined spatial profile on the surface of the substrate.

4. The apparatus according to claim 1, wherein the at least one mask opening comprises a plurality of mask openings disposed in a one-dimension or two-dimension periodic array.

5. The apparatus according to claim 1, wherein the mask is made of an electrically conductive material, and the mask is disposed at a non-null distance from the surface of the solid sample.

6. The apparatus according to claim 5, wherein the mask comprises a first conductive part, and a second conductive part electrically isolated from the first conductive part, the first conductive part comprising a first-type mask opening, and the second conductive part comprising a second-type mask opening,
wherein the electrical power supply is configured to apply a first direct-current bias voltage to the first conductive part and to apply a second direct-current bias voltage to the second conductive part.

7. The apparatus according to claim 1, wherein the mask comprises a first conductive part, and a second conductive part electrically isolated from the first conductive part, the first conductive part comprising a first-type mask opening, and the second conductive part comprising a second-type mask opening,
wherein the electrical power supply is configured to apply a first direct-current bias voltage to the first conductive part and to apply a second direct-current bias voltage to the second conductive part.

8. The apparatus according to claim 7, wherein the first direct-current bias voltage and the second direct-current bias voltage have opposite polarities at a same instant.

9. The apparatus according to claim 1, wherein the source of energy comprises one of:
(i) another electric power supply connected to a planar electrode disposed parallel to the sample holder and configured to generate a capacitively-coupled plasma,
(ii) another electric power supply connected to a coil electrode configured to generate an inductively-coupled plasma, and (iii) one or more of:
  a microwave antenna coupled to the plasma generation chamber via waveguides and configured to generate a microwave plasma, and
  a magnetic field generation system configured to generate a magnetic field in the plasma region.

10. The apparatus according to claim 2, wherein the at least one mask opening has a conical or cylindrical shape or a shape configured to generate a pattern with determined spatial profile on the surface of the substrate.

11. The apparatus according to claim 2, wherein the at least one mask opening comprises a plurality of mask openings disposed in a one-dimension or two-dimension periodic array.

12. The apparatus according to claim 3, wherein the at least one mask opening comprises a plurality of mask openings disposed in a one-dimension or two-dimension periodic array.

13. A method for patterning a solid sample, the method comprising:
  disposing a solid sample on a grounded sample holder of an apparatus for plasma processing;
  disposing a mask between the grounded sample holder and a plasma region of the apparatus for plasma processing, the mask having a first face, a second face, and at least one mask opening extending through the mask from the first face to the second face, the first face being oriented toward the plasma region and the second face being oriented toward a surface of the solid sample to be processed, the second face comprising an electrically insulating part in contact with the surface of the solid sample to be processed, the mask comprising at least one electrically conductive part on the first face and partially or fully covering the side walls of the at least one mask opening;
  injecting an input gas in the plasma region of the apparatus for plasma processing;
  applying an energy configured to excite the input gas and to generate a plasma in the plasma region; and
    applying a non-null direct-current bias voltage to the mask, the mask being disposed in contact with the surface of the solid sample to prevent plasma generation between the mask and the solid sample, said at least one mask opening being dimensioned and shaped to generate spatially selective patterned processing by selecting and focusing ions from the plasma on the surface of the solid sample.

14. The method according to claim 13, wherein a distance between the mask and the surface of the solid sample is adjusted to generate patterned features having one or more of determined size and profile.

15. The method according to claim 13, wherein the mask further comprises a first conductive part, and a second conductive part electrically isolated from the first conductive part, the first conductive part comprising a first-type mask opening, the second conductive part comprising a second-type mask opening, and
  the method further comprises:
    injecting a first input gas into the plasma region, applying a first direct-current bias voltage to the first conductive part and applying a second direct-current bias voltage to the second conductive part to generate a first-type patterned processing on the surface of the solid sample by selecting and focusing a first type of ions from the plasma through the first-type mask opening; and
    injecting another input gas into the plasma region, applying a third direct-current bias voltage to the first conductive part and applying a fourth direct-current bias voltage to the second conductive part to generate a second-type patterned processing on the surface of the solid sample by selecting and focusing another type of ions from the plasma through the second-type mask opening.

16. The method according to claim 13, wherein the method is performed for manufacture of one of a solar cell, a semiconducting device, and an optoelectronic device.

17. The method according to claim 13, wherein the input gas and the direct-current bias voltage are selected to generate, on the surface of the solid sample, one or more of respectively patterned layer deposition, patterned etching, patterned ion bombardment, patterned doping, patterned cleaning, patterned densification, and patterned surface functionalization.

18. The method according to claim 13, wherein the direct-current bias voltage is positive during one processing operation and, respectively, negative during another processing operation.

19. The method according to claim 13, wherein the direct-current bias voltage is adjusted in amplitude to generate spatially selective patterned features having one or more of determined size and profile.

* * * * *